US007825000B2

(12) United States Patent
Kanakasabapathy et al.

(10) Patent No.: US 7,825,000 B2
(45) Date of Patent: Nov. 2, 2010

(54) METHOD FOR INTEGRATION OF MAGNETIC RANDOM ACCESS MEMORIES WITH IMPROVED LITHOGRAPHIC ALIGNMENT TO MAGNETIC TUNNEL JUNCTIONS

(75) Inventors: Sivananda K. Kanakasabapathy, Niskayuna, NY (US); Solomon Assefa, Elmsford, NY (US)

(73) Assignee: International Business Machines Corporation, Armonk, NY (US)

( * ) Notice: Subject to any disclaimer, the term of this patent is extended or adjusted under 35 U.S.C. 154(b) by 383 days.

(21) Appl. No.: 11/850,427

(22) Filed: Sep. 5, 2007

(65) Prior Publication Data

US 2009/0059656 A1    Mar. 5, 2009

(51) Int. Cl.
H01L 21/76 (2006.01)
H01L 21/00 (2006.01)

(52) U.S. Cl. .......................... 438/401; 438/73; 438/403; 438/462; 438/797; 438/975; 430/5; 430/302; 430/369; 257/422; 257/423; 257/428; 257/E21.035; 257/E21.038; 257/E23.179; 257/E27.005

(58) Field of Classification Search .................... 438/3, 438/73, 401, 403, 422, 428, 462; 430/5, 430/302, 396; 257/421, 422, 428, E21.035, 257/E21.038, E23.179, E27.005
See application file for complete search history.

(56) References Cited

U.S. PATENT DOCUMENTS 5,640,343 A    6/1997  Gallagher

| 6,518,588 | B1 | 2/2003 | Parkin |
| 6,858,441 | B2 * | 2/2005 | Nuetzel et al. .................. 438/3 |
| 6,933,204 | B2 * | 8/2005 | Sarma et al. ................. 438/401 |
| 6,979,526 | B2 | 12/2005 | Ning |
| 7,149,105 | B2 | 12/2006 | Brown |
| 7,211,446 | B2 | 5/2007 | Gaidis |
| 7,223,612 | B2 | 5/2007 | Sarma |
| 7,507,633 | B2 * | 3/2009 | Kanakasabapathy et al. ..... 438/401 |

OTHER PUBLICATIONS

S. Tehrani et al "Magnetoresistive Random Access Memory Using Magnetic Tunnel Junctions;", Proc. of the IEEE, vol. 91, No. 5, pp. 703-714 (May 2003).
W. Reohr et al. "Memories of Tomorrow," IEEE Circuits & Devices Magazine, pp. 17-27 (Sep. 2002).
B.N. Engel et al., "The Science and Technology of Magnetoresistive Tunneling Memories," IEEE Trans. On Nanotech., vol. 1, No. 1, pp. 32-38 (Mar. 2002).
Sitaram, A 0.18μm Logic-based MRAM Technology for High Performance Nonvolatile Memory Applications 2003 Symposium on VLSI Digest of Technical Papers pp. 15-16 (2003).

* cited by examiner

*Primary Examiner*—Dao H Nguyen
(74) *Attorney, Agent, or Firm*—Graham S. Jones, II; Louis J. Percello; Robert M. Trepp (57) ABSTRACT

A magnetic memory device including a Magnetic Tunnel Junction (MTJ) device comprises a substrate and Front End of Line (FEOL) circuitry. A Via level (VA) InterLayer Dielectric (ILD) layer, a bottom conductor layer, and an MTJ device formed over the top surface of the VA ILD layer are formed over a portion of the substrate. An alignment region including alignment marks extends through the bottom conductor layer and extends down into the device below the top surface of the VA ILD layers is juxtaposed with the MJT device.

22 Claims, 11 Drawing Sheets

METHOD FOR INTEGRATION OF MAGNETIC RANDOM ACCESS MEMORIES WITH IMPROVED LITHOGRAPHIC ALIGNMENT TO MAGNETIC TUNNEL JUNCTIONS

BACKGROUND OF THE INVENTION

The present invention relates to semiconductor memory devices in the form of Magnetic Tunnel Junction (MTJ) cells of the type used as storage elements in Magnetic Random Access Memory (MRAM) devices and more particularly to alignment structures formed therein and methods of manufacture thereof.

MRAM devices are based on arrays of MTJ cells. An MTJ cell is a MagnetoResistive (MR) device also known as a Tunnel Junction (TJ) which consists inter alia of two magnetic films; a Pinned Layer (PL) and a Free Layer (FL) separated by a tunnel barrier layer. The PL of the MTJ cell has an irreversible direction of magnetization as it is pinned or fixed by a variety of techniques. In contrast, the magnetization of the FL of the MTJ cell is programmable to be either parallel or anti-parallel to that of the PL during a "WRITE" operation in which data is stored in a memory cell. A thin tunnel barrier which is typically composed of aluminum oxide ($Al_2O_3$) is sandwiched between the PL and FL. The resistance of the MTJ cell depends on the direction of the FL magnetization relative to the direction of the PL magnetization. The state of the MTJ cell is sensed in the "READ" operation by measuring the alternatively high or low resistance level of the MR type of tunnel junction.

MTJ cells comprise spin electronic devices which combine semiconductor technology with magnetic materials and devices. The selective reversibility of spin directions of electrons through reversal of their magnetic moments in the magnetic free-layer stack of an MTJ cell, is employed to provide binary MTJ cells which indicate the presence of data in the form of a "ONE" or the absence of data in the form of a "ZERO." A typical spin electronic device is a Magnetic Random Access Memory (MRAM) device which includes a conductive wordline array and a conductive bitline array (formed in different metal layers.) The conductive wordline and bitline arrays, which are oriented in transverse (usually perpendicular) directions, sandwich a plurality of separate MTJ cells, which combine to function as a MRAM device.

Commonly assigned U.S. Pat. No. 5,640,343 of Gallagher et al. entitled "Magnetic Memory Array Using Magnetic Tunnel Junction Devices in the Memory Cells" describes a technique of employing a pair of mutually perpendicular arrays of metal wires with a MTJ cell placed at each of the intersections of two wires in the two arrays. The MTJ cell is uniquely addressed in the array of MTJ cells by the two wires that intersect above and below the particular MTJ cell of interest.

Commonly assigned U.S. Pat. No. 6,518,588 of Parkin et al. entitled "Magnetic Random Access Memory with Thermally Stable Magnetic Tunnel Junction Cells" describes an MTJ cell which includes a platinum-manganese (Pt—Mn) antiferromagnetic layer, a pinned ferromagnetic CoFe alloy layer, an alumina insulating tunnel barrier layer, and a free ferromagnetic NiFe alloy layer. The MTJ cell includes an underlayer and a capping layer. The underlayer is a bilayer comprising a low-resistivity alpha-tantalum (Ta) layer formed on a tantalum nitride (TaN) seed layer which is deposited on both an $SiO_2$ insulating material and on a stud which provides an electrical connection to an M2 level word line. The capping layer is a bilayer comprising a TaN layer formed on the tree ferromagnetic layer and an alpha-Ta layer between the TaN layer and an M3 level bit line. Because the studs and metallization layers are preferably formed of copper (Cu), the Ta and TaN must be non-reactive with Cu. Also, the Ta must be non-reactive with Pt—Mn, which is the preferred antiferromagnetic material.

Commonly assigned U.S. Pat. No. 6,933,204 of Sarma et al entitled

"Method for Improved Alignment of Magnetic Tunnel Junction Elements" describes formation of a semiconductor memory array with MTJ elements and a method for exposing a set of pre-existing M2 level alignment marks below subsequently deposited MTJ metallization. The method comprises forming an MTJ stack layer over an optically transparent layer composed of a Tantalum Nitride (TaN) layer formed on a lower metallization level after the pre-existing M2 level copper alignment marks were formed in the lower M2 metallization level. Then a portion of the MTJ stack layer is patterned and opened in the location of the pre-existing alignment marks in the lower metallization level so as to render the pre-existing alignment marks optically visible. The method employs patterning of the MTJ stack layer with respect to the lower metallization level, using the previously patterned, pre-existing optically visible alignment marks, but it does not relate to formation of alignment marks during the formation of MTJ alignment marks, which are required for subsequent processing steps in the manufacture of MTJ memory devices. A hard mask comprising a Titanium Nitride (TiN) layer is formed over the MTJ stack layer. A photoresist material which is used to pattern the MTJ stack layer with respect to the lower metallization level is also used to protect the opened portion of the MTJ stack layer corresponding to the location of the alignment marks. Also an oxide hardmask is shown formed over an exposed portion of the optically transparent layer as a result of the patterning and opening a portion of the MTJ stack layer.

Figure 1A:
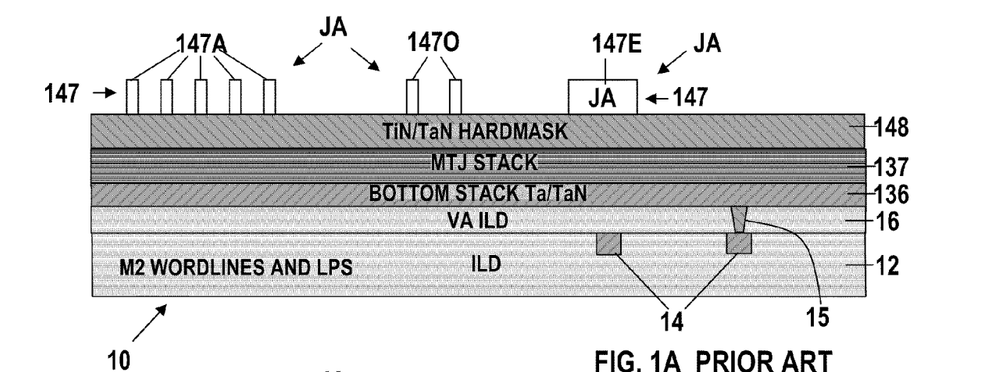
FIGS. 1A-1C are sectional elevational views of an MRAM device in the process of being manufactured in accordance with a prior method of manufacturing MTJ devices.
Figure 1B:
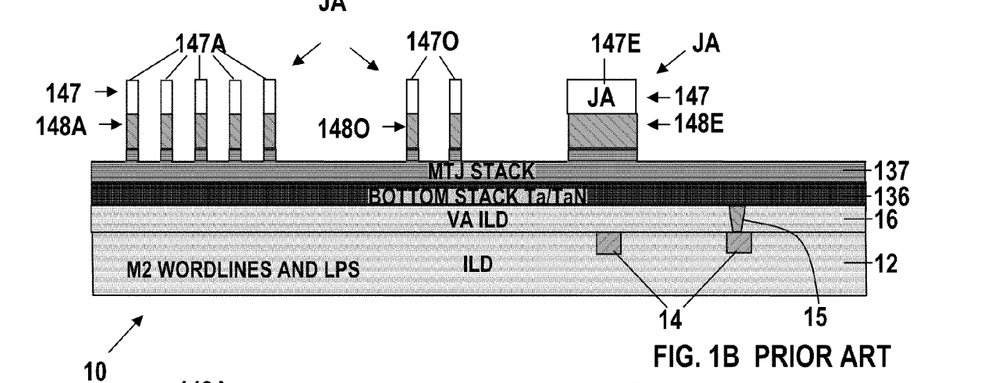
Figure 1C:
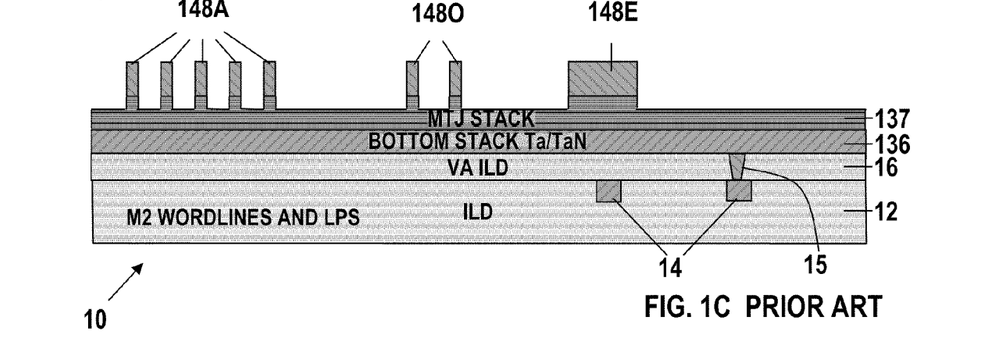

FIGS. 1A-1C are sectional elevational views of an MRAM device 10 in the process of being manufactured in accordance with a prior method of manufacturing MTJ devices.

FIG. 1A shows a sectional elevational view of a prior art MRAM device 10 in an intermediate stage of the process of manufacture thereof. The device 10 comprises a lower Inter Level Dielectric (ILD) substrate layer 12 in the upper surface of which, electric conductors 14 have been formed for providing electrical interconnections between features within the device 10. A via level (VA) ILD layer 16 composed of a refractory material, e.g. a bilayer of tantalum over tantalum nitride, has been formed on the top surface of the lower ILD substrate layer 12. A via 15 is shown formed on the top surface of one of the electric conductors 14. A bottom stack conductor layer 136, which is shown to be composed of Ta/TaN, is formed over the VA ILD layer 16 in electrical contact with the via 15 and one of the conductors 14 therebelow. An MTJ stack 137 of layers of material to be formed into TJ devices is formed on the top surface of the bottom stack conductor layer 136. On the top surface of the MTJ stack 137 is an electrically conductive hard mask layer 148 comprising TiN/TaN layers. The electrically conductive hard mask layer 148 can be composed of a hard mask material such as Ti, TiN, Ta, TaN, W and the like, but is not limited to refractory metals and their alloys, as will be well understood by those skilled in the art.

A multiple feature Lithographic Patterning Level (JA) level mask 147 is formed on the top surface of the electrically conductive hard mask layer 148. The JA mask 147 is used to define the Magnetic Tunnel Junction (MTJ) elements. The JA level mask 147 includes a plurality of parallel alignment mark pattern lines 147/A, OVERLAY (O/L) box pattern lines 147/

0, and an MTJ element pattern block 147E. The JA level mask 147 is to be employed for patterning several alignment marks, two OVERLAY box features, and an MTJ element 137 as shown in FIGS. 1B and 1C.

The JA level mask 147 is employed at a level in the process of manufacturing which is unique to the manufacturing of MRAM devices. The JA lithographic patterning level requires printing and etching of elliptical or circular shapes on MTJ metal stack 137. Unfortunately, there could be a problem with peeling of a plurality of JA alignment mark features 148A, which are shown in FIG. 1C, as metal stacks tend to peel and delaminate after patterning when cast into elongated shapes such as long lines needed in the alignment mark features 148A. Also the top of the MTJ hard mask 148 (e.g. TiN/TaN) in some cases is too rough to allow the alignment optical system of the stepper to detect a clearly identifiable image of the alignment mark features 148A. The JA level mask is employed to pattern the MTJs. The JA alignment mark features 148A combined with the MTJ stacks inside peel/curl up after deionized DI water rinse or subsequent processing. Poor JA marks often require alignment to the bitline to M2 , or VA level rather than alignment to the more preferable alignment to the JA lithographic patterning level.

FIG. 1B shows the device 10 of FIG. 1A after etching away the exposed portions of the hard mask layer 148 and a partial thickness of the MTJ stack top layers 137 leaving the plurality of parallel alignment mark features 148A, two parallel OVERLAY Box features 148O, and an MTJ element feature 148E below the plurality of parallel alignment mark pattern lines 147A, the two parallel OVERLAY Box pattern lines 147O, and the MTJ element pattern block 147E of the JA level mask 147.

FIG. 1C shows the device 10 of FIG. 1B after stripping of the JA level mask 147 including the parallel alignment mark pattern lines 147A, the OVERLAY Box pattern lines 147O, and the MTJ element pattern block 147E. The alignment mark features 148A, two parallel OVERLAY Box features 148O, and the MTJ element feature 148E remain exposed after the step pf stripping JA level mask 147.

Figure 2A:
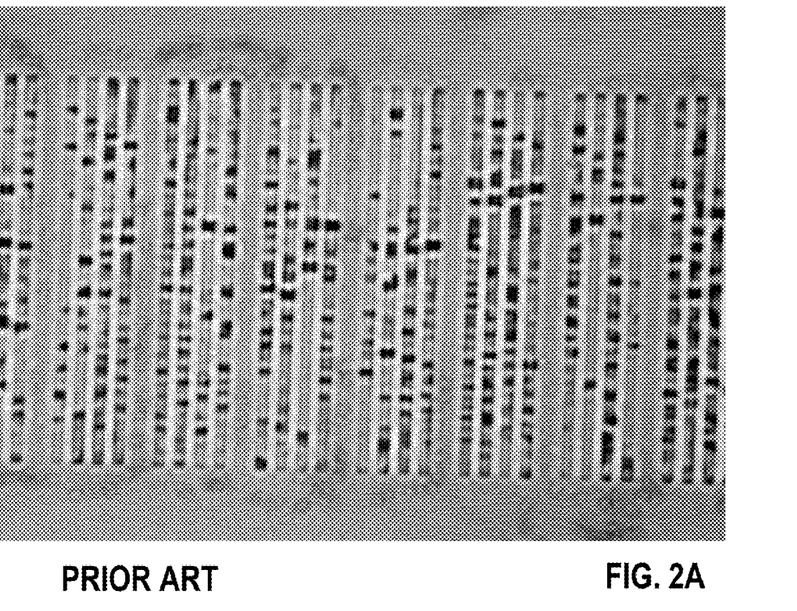
FIG. 2A is a photomicrograph showing a magnified plan view of an MRAM composed of MTJ elements with alignment marks formed as shown in FIG. 1C.

FIG. 2A is a photomicrograph showing a magnified plan view of an MRAM composed of MTJ elements with alignment marks formed as shown in FIG. 1C.

Figure 2B:
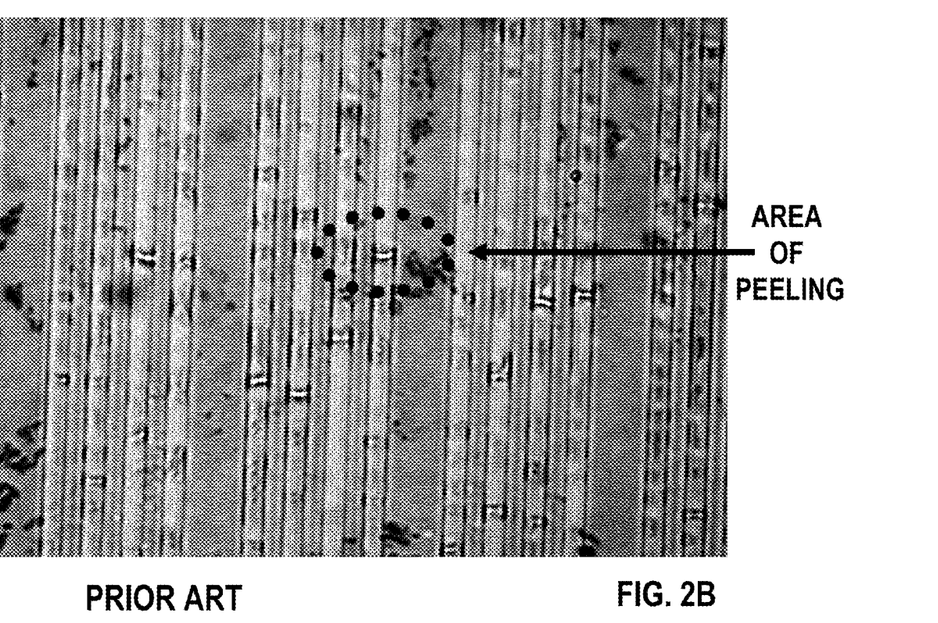
FIG. 2B is a further magnified view of a portion of the photomicrograph shown in FIG. 2A with the ellipse of dots around alignment marks which could potentially be damaged by peeling.

FIG. 2B is a further magnified view of a portion of the photomicrograph shown in FIG. 2A with the ellipse of dots around alignment marks which could potentially be damaged by peeling.

Figure 3:
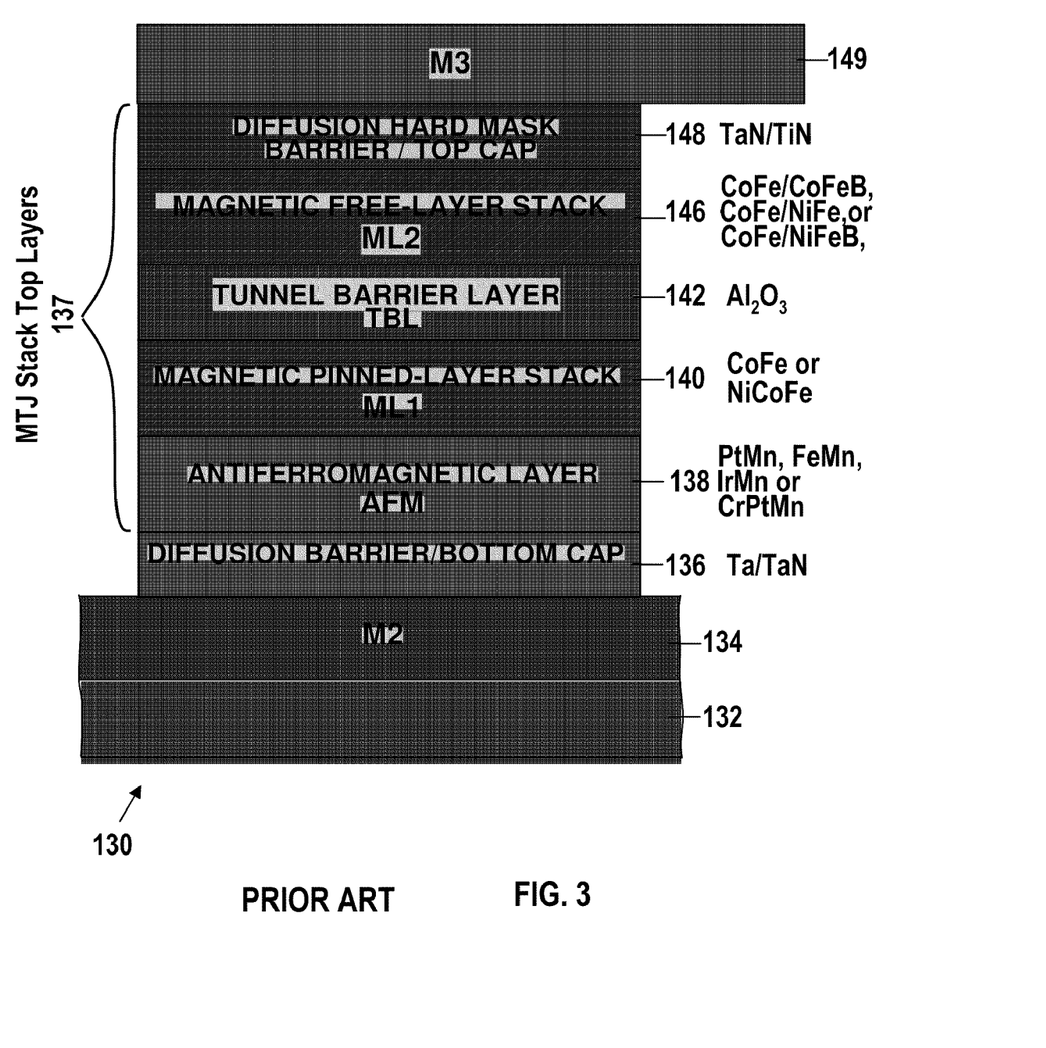
FIG. 3 shows a sectional elevation of prior art MTJ structure comprising a dielectric substrate covered by a conductive line (i.e. a bitline or a wordline) providing electrical connections to a plurality of sets of MTJ stack top layers thereabove.

FIG. 3 shows a sectional elevation of prior art MTJ structure 130 comprising a dielectric substrate 132 covered by an M2 conductive line 134 (i.e. a bitline or a wordline) providing electrical connections to a plurality of sets of MTJ stack top layers 137 thereabove. Each of the sets of MTJ stack top layers 137 comprises the pinned magnetic films ML1 film 140 (magnetically pinned by an AntiFerroMagnetic (AFM) film 138,) the free magnetic ML2 film 146, non-magnetic films 136/148 and a tunnel barrier layer (TBL) 142 between the ML1 film 140 and the ML2 film 146. Conventionally, the ML1 and ML2 magnetic films 140 and 146 are composed of ferromagnetic alloys of combinations of Co, Fe and/or Ni, etc. The various non-magnetic films of a bottom cap adhesion layer 136 and a hard mask top cap layer 148 are refractory metals and/or a nitride thereof such as Ta, Ti, TiN, and TaN or their compounds. The MJT stack 137 is typically bounded on the bottom by a diffusion barrier/bottom cap 136 and on the top by the diffusion hard mask barrier top cap 148. The complex stack with several interfaces is believed to be the cause for such stress induced peeling of material in the regions of alignment marks referred to above.

Referring again to FIG. 3, the bottom cap adhesion layer 136 is formed on the top surface of the M2 conductive line 134. The set of multi-layered MTJ stack top layers 137 is formed on top of the bottom cap adhesion layer 136. The MTJ stack top set of layers 137 includes from bottom to top an antiferromagnetic (AFM) layer 138, shown in FIG. 3 as PtMn, FeMn, IrMn, or CrPtMn, a magnetic pinned-layer (ML1 ) stack 140, shown as CoFe or NiCoFe, a tunnel barrier layer (TBL) 142, shown as $Al_2O_3$, a magnetic free-layer (ML2 ) stack 146, shown as CoFe/CoFeB, CoFe/NiB or CoFe/NiFeB TaN/TiN, and a diffusion barrier, hard mask top cap layer 148, shown as TaN/TiN on top. The device 130 typically includes the following layers listed in order, from the bottom up: the bottom cap, adhesion layer 136, typically including 5 nm to 10 nm of TaN and/or Ta, the relatively thick AFM layer 138, illustratively including a 20 nm thick layer of PtMn, FeMn, IrMn or CrPtMn. Next is the ferromagnetic "reference" layer or set of layers ML1 stack 140 formed overlying and pinned by the AFM layer 138 comprised of films such as CoFe, NiFe or NiCoFe, which may be interspersed with a nonmagnetic coupling layer such as Ru or TaN that is used to reduce offsets from demagnetization fields. A representative thickness of such a ML1 reference layer(s) is 2 to 5 nm. The foregoing layers make up the pinned layer of such an MTJ device 130. The purpose of the AFM layer 138 is to fix the ferromagnetic reference layer(s) in ML1 stack 140 so that they will not switch magnetization direction during normal operation, thus providing a reference against which to compare the free layer magnetization direction of the ML2 layer 146 which will be switched between "ZERO" and "ONE" (or the reverse thereof) during normal operation of such an MRAM memory device.

The Tunnel Barrier Layer (TBL) 142 of this tunneling MR device 130 comprises a thin dielectric layer deposited onto the top surface of the ML1 stack 140, i.e. the magnetic pinned-layer. Typically, the TBL 142 is formed of an oxide of aluminum, such as including or similar to aluminum oxide ($Al_2O_3$) having a thickness of about 1 nm. Other materials available for use as the TBL 142 include oxides of magnesium and other metals, oxides of silicon, nitrides of silicon, and carbides of silicon; as well as oxides, nitrides and carbides of other elements, or combinations of elements and other materials including or formed from semiconducting materials which provide MR tunneling effects as will be well understood by those skilled in the art.

The free-layer ML2 stack 146 that is formed over the tunnel barrier layer 142 may comprise a layer of nickel-iron (NiFe) having a thickness of about 5 nm. In an alternative embodiment, the ML2 stack 146 can be formed of more than one such ferromagnetic layer to enhance performance or manufacturability. Suitable alternative materials include CoFe/CoFeB, CoFe/NiFe, CoFe/NiFeB, Fe, and equivalent free layer materials or a combination of them. That is to say that, NiCoFe, amorphous CoFeB, and similar ferromagnets can be used in place of NiFe as the ferromagnetic portion of the ML2 stack 146.

Thereafter, a conductive barrier top cap layer 148 of tantalum nitride (TaN) or titanium nitride (TiN) having a thickness of about 100 nm is deposited. The conductive barrier top cap layer 148 serves to protect the free-layer ML2 stack 146 during subsequent processing and to provide adhesion for one or more subsequently formed layers. Multiple layers may be separated by non-magnetic layers like TaN or Ru. These layers typically range in thickness from 2 to 10 nm.

The diffusion barrier, hard mask top cap layer 148 is formed on top of the ML2 layer 146 forming the top surface of the layered stack top layers 137. In the simplest embodiment, the hard mask cap layer 148 is formed from a conductive material such as tantalum nitride (TaN) or titanium nitride (TiN). An M3 conductive line 149 is formed over the hard mask cap layer 148 for providing the other electrical connection to the MTJ stack top layers 137.

W. Reohr et al. "Memories of Tomorrow," IEEE Circuits & Devices Magazine, pp 17-27 (September 2002) describes a one-transistor-one-MTJ memory cell embodiment of this technology expected to have high write endurance and smaller cell size than SRAM devices and shows an MRAM with arrays of word and bit lines connected to MTJ devices.

S. Tehrani et al "Magnetoresistive Random Access Memory Using Magnetic Tunnel Junctions;", Proc. of the IEEE, Vol. 91, no. 5, pp 703-714 (May 2003) states that MRAM devices have a large MR effect so that the resistance thereof depends on its magnetic state. Typical MRAM cells are bistable so they can be written to a high or low resistance state and retain that state without any applied power.

B. N. Engel et al., "The Science and Technology of Magnetoresistive Tunneling Memories," IEEE Trans. On Nanotech., Vol. 1, No. 1, pp 32-38 (March 2002) states that the advantages of MRAM devices include nonvolatility, high-speed operation and unlimited read and write endurance, enabled by the ability to deposit high-quality, nanometer scale tunneling barriers that display enhanced MR response embodied in a 256-kb memory chip. The MRAM module, is inserted in the Back-End-Of-Line (BEOL) interconnect using four additional lithography steps.

A. R. Sitaram et al. "A 0.18 μm Logic-based MRAM Technology for High Performance Nonvolatile Memory Applications", Proc. of the VLSI Symposium pp 15-16 (2003) describes alignment of subsequent mask levels to MTJs shows a schematic diagram of an FET MRAM cell with a via VA connecting from an FET through a local interconnect line MA to an MTJ which is connected at the other end to a bit line.

An engineering challenge in inserting MRAM devices during Back End Of Line (BEOL) semiconductor processing of Complementary Metal Oxide Semiconductor (CMOS) integration, is encountered in attempting to provide lithographic alignment of MTJ structures to the metal level therebelow. In most conventional BEOL processing, intermediate dielectric films formed over alignment marks are optically transparent. Since those dielectric films are transparent the stepper machines used to expose devices with accurate alignment of masks to workpieces are enabled by using optical sensors to detect the location of the alignment marks formed on the metallization level below such dielectric films. However, when a MTJ metal stack is opaque there is the problem that the alignment marks of the metal level therebelow are not visible.

U.S. Pat. No. 6,858,441 of Neutzel et al entitled "MRAM MTJ stack to conductive line alignment method" teaches techniques for providing alignment of MTJ devices to levels of metallization therebelow.

As typical in the state of the art, the alignment marks and overlay boxes (collectively referred to as alignment marks from here onwards) are formed lithographically and etched simultaneously as the MTJ elements as shown in FIGS. 1A and 1B. The MTJ elements are typically elliptical elements of various aspect ratios. The alignment marks are on the other hand long lines that are several microns in length. Whereas the MTJ stack is conducive to be cast into such oblong elements. It tends to peels and deform when cast into long features as in the alignment marks as in data from FIGS. 2A and 2B.

The variability introduced into the scattering of the laser light used by steppers to sense the alignment marks could contribute to poor alignment.

SUMMARY OF THE INVENTION

It is an object of this invention to improve alignment to the JA lithographic patterning level by eliminating the problems associated with the peeling of JA alignment marks.

This invention allows for a scheme to circumvent the problem of peeling or roughness and hence to provide a satisfactorily reliable form of alignment marking of MJT devices formed during JA lithographic processing.

In accordance with this invention, techniques are provided for aligning subsequent upper lithographic levels to MTJ structures. More specifically, the present invention provides techniques for creating enhanced alignment marks at the level of the MTJ structures that can be invoked while aligning subsequent upper levels.

In accordance with this invention, a magnetic memory device includes a Magnetic Tunnel Junction (MTJ) device formed on a substrate including Front End of Line (FEOL) circuitry. A Via level (VA) InterLayer Dielectric (ILD) layer is formed over at least a portion of the substrate. A bottom conductor layer is formed over the top surface of the VA ILD layer. An MTJ device is formed over the bottom conductor layer. An alignment region which is juxtaposed with the MJT device, includes alignment marks extending through the bottom conductor layer and extending down into the device below the top surface of the VA ILD layer. Preferably, the alignment marks are formed in an area where material of the MTJ device is absent. It is preferred that an alignment base layer is formed below the VA ILD layer. The alignment marks extend through the VA ILD layer and at least into the alignment base layer; and the alignment base layer is composed of a refractory material. Preferably, the alignment marks extend through the VA ILD layer and at least into the substrate; the substrate comprises an ILD layer for electrical connection lines; and the VA ILD and the bottom conductor layer are composed of refractory materials. Preferably, a Protective Hard Mask Patterning (PHMP) mask is formed over the alignment marks and the MJT device with the MJT device including a free layer, a pinned layer and a tunnel barrier layer disposed between the free layer and the pinned layer.

In accordance with another aspect of this invention, a method is provided for forming a magnetic memory device including a Magnetic Tunnel Junction (MTJ) device which includes the following steps. Form a via level InterLayer Dielectric (ILD) layer over a substrate. Form a bottom stack conductor layer, an MTJ stack and a conductive hard mask layer over the ILD layer. Form an alignment mask over the device exposing an alignment region. Then etch away the hard mask layer and expose the bottom stack conductor in the alignment region thereby separating the MTJ stack from the alignment region. Form a Lithographic Patterning Level (JA) level mask with openings over the alignment region and aside therefrom except for an MJT region aside from the alignment region. Then etch through the pattern openings in the JA level mask to perform MJT element patterning and alignment mark patterning below the JA level mask. Preferably, strip the JA level mask after etching therethrough. Then form a Protective Hard Mask Patterning (PHMP) mask over the device covering the alignment region. Preferably, the bottom stack conductor layer in the alignment region contains material similar in etch characteristics to the conductive hard mask layer aside from the MJT element. It is preferred that an MJT element is formed over the bottom stack conductor layer and alignment marks are carved through the bottom stack conductor layer in the alignment region during etching through the JA level mask. Preferably, form an alignment base recess extending through the via level ILD layer and down into the top surface of the substrate prior to forming the bottom stack conductor layer, the MTJ stack and the conductive hard mask layer; and preferably form a conductive, alignment base composed of refractory material filling the alignment base recess; and planarize the conductive alignment base.

The invention and objects and features thereof will be more readily apparent from the following detailed description and appended claims when taken with the drawings.

The detailed description which follows explains the preferred embodiments of the invention, together with advantages and features with reference to the drawings.

DETAILED DESCRIPTION OF PREFERRED EMBODIMENTS OF THE INVENTION

FIGS. 4A-4L are sectional elevational views of an MRAM device 110 in the process of being manufactured in accordance with the method of this invention. In accordance with this invention, techniques are provided for aligning subsequent upper lithographic levels to MTJ structures. More specifically, the present invention provides techniques for creating enhanced alignment marks at the level of the MTJ structures that can be invoked while aligning subsequent upper levels.

Step A

Figure 4A:
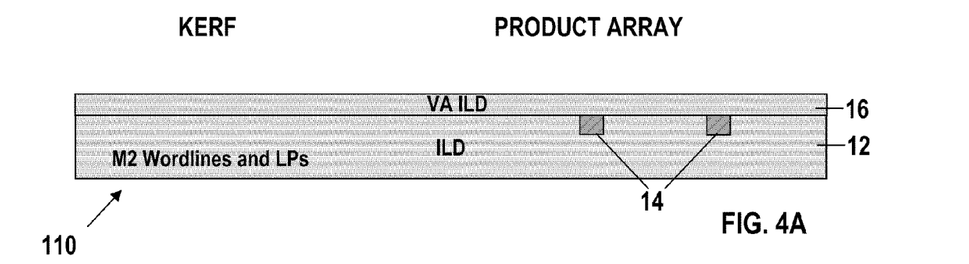
FIGS. 4A-4L are sectional elevational views of an MRAM device in the process of being manufactured in accordance with the method of this invention.

FIG. 4A shows a sectional elevational view of an MRAM device 110 in an early stage of manufacture. The device 110 comprises a lower Inter Level Dielectric (ILD) substrate layer 12 in the upper surface of which, electric conductors 14 have been formed for providing electrical interconnections between features within the device 110. A via level (VA) ILD layer 16 composed of a refractory material, e.g. a bilayer of tantalum over tantalum nitride, has been formed on the top surface of the lower ILD substrate layer 12. In FIG. 4D, a via 15 is shown formed on the top surface of one of the electrical conductors 14. A kerf region is shown on the left and a product array is shown on the right of FIG. 4A.

Step B

Figure 4B:
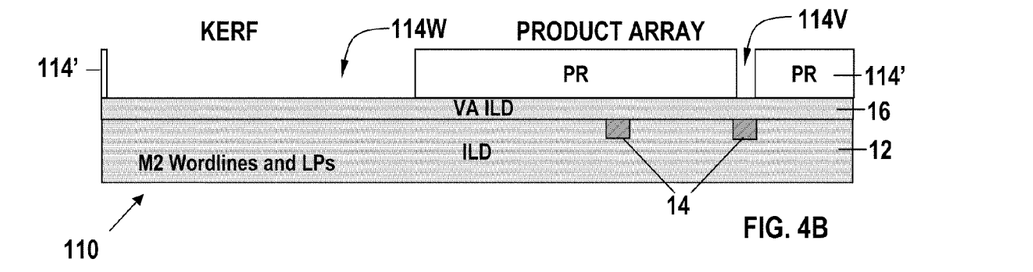
Figure 4C:
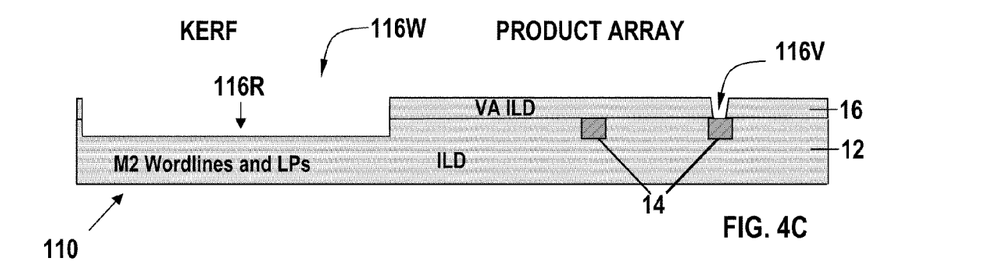
Figure 4D:
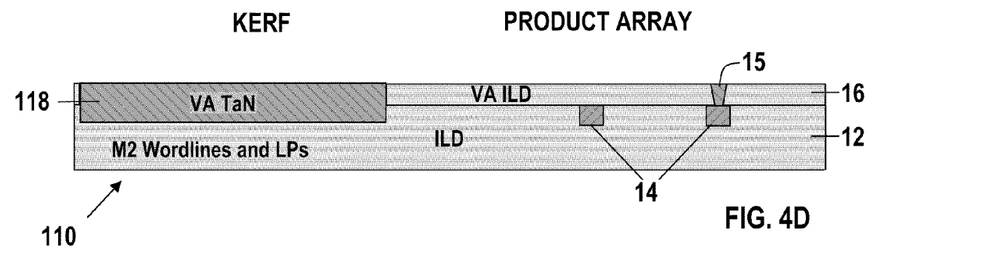

FIG. 4B shows MRAM device 110 of FIG. 4A after an alignment base mask (PR) 114 has been formed over the via level (VA) ILD layer 16 with a first window 114W therethrough in the KERF region of the device 110 and a second window 114V therethrough over the ILD layer 16 directly above and aligned with a first one of the electrical conductors 14 provided in the location of the via 15 of FIG. 4D.

Step C

FIG. 4C shows MRAM device 110 of FIG. 4B after etching down through the entire thickness of the via level (VA) ILD layer 16 to form a via hole 116V over the first one of the electrical conductors 14 in the product array region and continuing in the KERF region to etch partially through the ILD substrate layer 12 forming an Alignment Base (AB) recess 116R extending through the VA ILD layer 16 and down into the top surface of the ILD substrate layer 12.

Step D

FIG. 4D shows MRAM device 110 of FIG. 4C after stripping the PR mask 114' and depositing a via conductor 15 and a conductive, VA alignment base material 118 composed of refractory material over the device 110. The conductive VA Alignment Base AB 118, which is composed of TaN, fills the alignment base recess 116R. As shown the VA alignment base 118 has been planarized to be coplanar with the surface of the via level VA ILD layer 16 and the VA Alignment Base AB 118 extends below the bottom surface of layer 16 down reaching partially down through the top surface of the lower ILD substrate layer 12 and into the body below the top surface thereof. The conductive, VA alignment base 118 TaN has been planarized, by steps well understood by those skilled in the art. Thus the VA alignment base 118 which coplanar with the VA ILD layer 16 is ready for the subsequent steps of forming layers shown in FIG. 4D over the top surface of device 110.

Step E

Figure 4E:
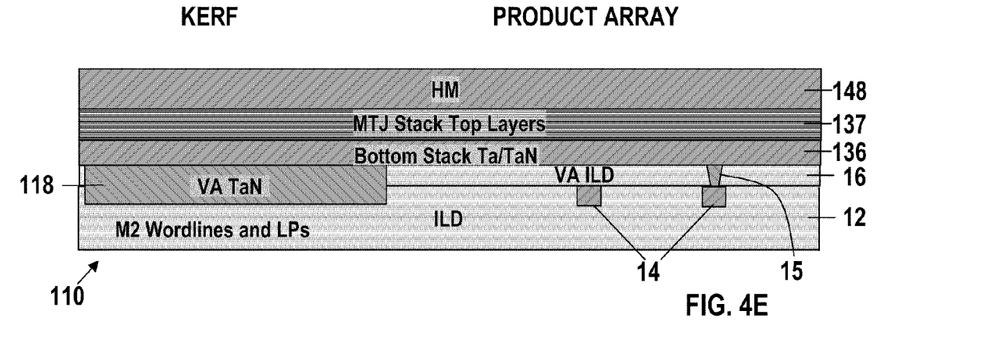

FIG. 4E shows MRAM device 110 of FIG. 4D after a blanket bottom stack conductor layer 136 composed of Ta/TaN as described above has been formed over the top surfaces of the VA ILD layer 16 and the VA alignment base material 118 composed of refractory material. It should be noted that the bottom stack conductor layer 136, which is shown to be composed of Ta/TaN, is in electrical contact with the via 15 and the conductor 14 therebelow as in FIGS. 1A-1C. Also as in FIGS. 1A-1C, a blanket MTJ stack layers 137 of material to be formed into TJ devices is formed on the top surface of the bottom stack conductor layer 136 of the kind shown in FIG. 3. A blanket electrically conductive hard mask (HM) layer 148 comprising TiN/TaN layers is formed on the top surface of the MTJ stack 137.

Step F

Figure 4F:
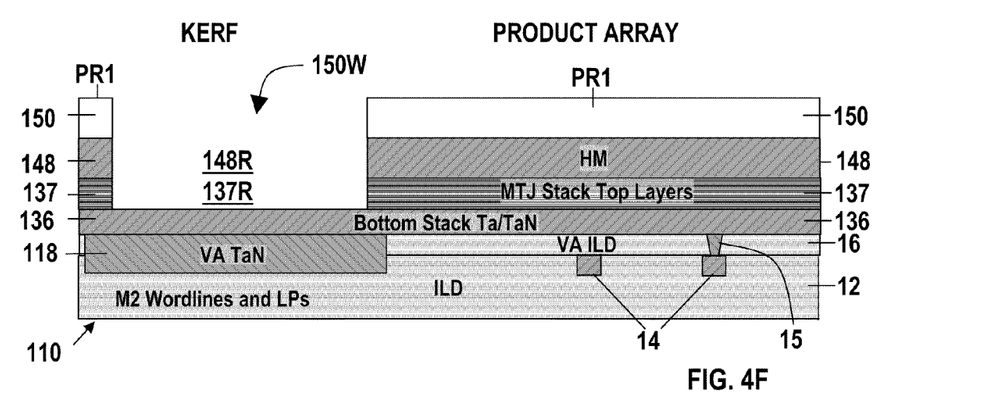

FIG. 4F is a sectional elevational view which shows the MRAM device 110 of

FIG. 4E after formation of an alignment region mask PRI with a window opening 150W therethrough over the HM layer 148 in the kerf region. An alignment base recess 148R/137R has been formed by etching through the HM layer 148 and the MTJ stack 137 below the window opening 150W exposing a portion of the top surface of the bottom stack conductor layer 136 through which alignment marks will be etched in subsequent processing steps G-J which are described below.

Step G

Figure 4G:
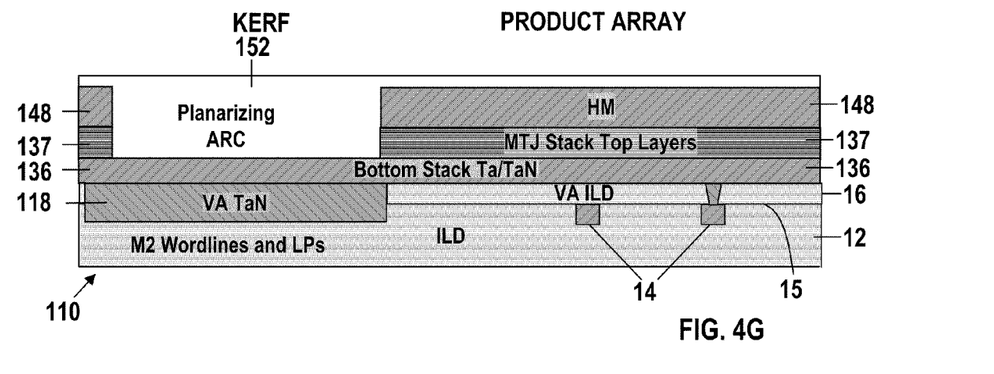

FIG. 4G is a sectional elevational view which shows the MRAM device 110 of

FIG. 4F after formation of a planarizing Anti Reflective Coating (ARC) layer 152 filling the alignment recess 148R/137R that was formed below the window 150W and providing a planar of surface of device 110.

Step H

Figure 4H:
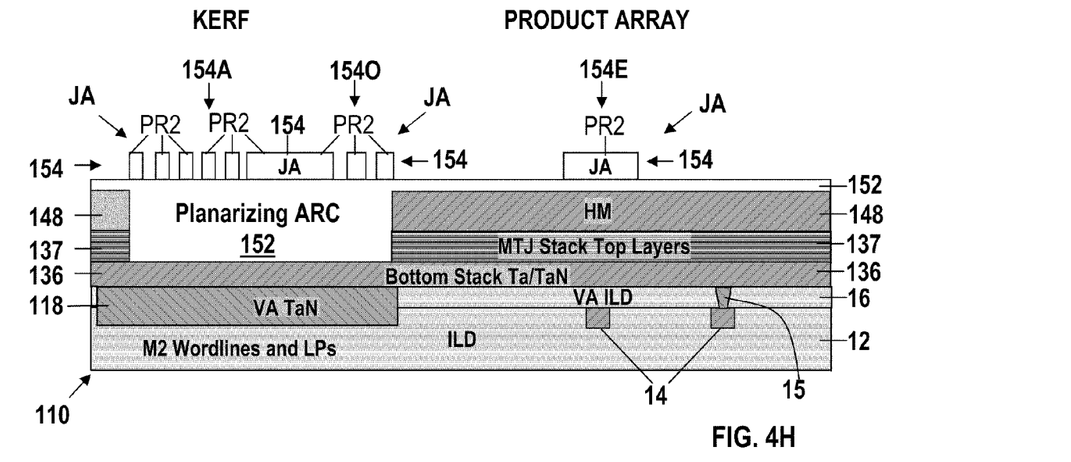

FIG. 4H is a sectional elevational view which shows the MRAM device 110 of

FIG. 4G after formation of a multiple feature Lithographic Patterning Level (JA) level mask 154 formed on the top surface of the planarizing ARC layer 152 and extending thereabove. Unlike the prior art structure of FIG. 1A as the JA level mask (PR2) 154 is spaced above the electrically conductive hard mask layer 148 by the intervening layer of the planarizing ARC layer 152. The JA level mask 154 includes a plurality of parallel alignment mark patterns 154A, two parallel OVERLAY box patterns 154O over the Alignment Base AB 118 composed of refractory material in the kerf region. The JA level mask 154 also includes an MTJ element pattern 154E in the product array region. The JA level mask 154 is to be employed for patterning several alignment marks, two OVERLAY box features, and an MTJ element as shown in FIGS. 1B and 1C. The ARC layer 152 material and the bottom stack material 136 in the alignment region comprises material similar in etch characteristics to the material of the hardmask 148 (e.g. TiN/TaN) over the MTJ element TJ shown in FIG. 4I. The bottom stack material 136 is composed of refractory metals and/or a nitride thereof such as Ta, Ti, TiN, and TaN or their compounds. The ARC layer 152 is preferably composed of such a refractory material.

As stated above, the JA lithographic patterning level masking requires printing and etching of shapes on the MTJ metal stack 137. Unfortunately, metal stacks such as stack 137 tend to peel and delaminate after patterning when cast into shapes such as long lines needed in the alignment marks 148A shown in FIG. 1C. Also the top of the MTJ hard mask 148A (e.g. TiN/TaN) in some cases is too rough to allow the alignment optical system of the stepper to detect a clearly identifiable image of the alignment marks, which has led to the approach of FIGS. 4A-4K. The JA masking level of FIG. 4H is employed to pattern the MTJs.

Step I

Figure 4I:
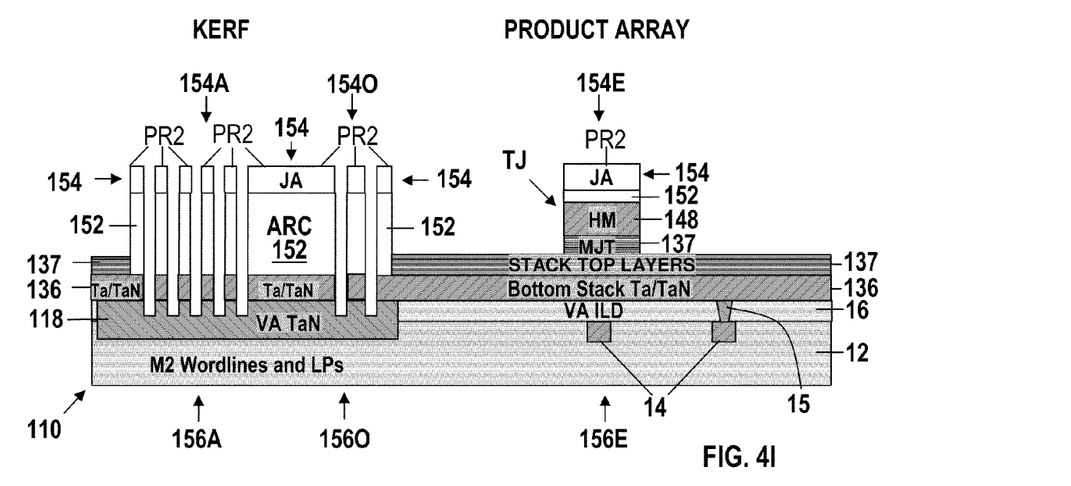

FIG. 4I shows the device 110 of FIG. 4H atter an etching step which transfers alignment mark patterns 154E into the material in bottom stack conductor layer 136 and the refractory, VA alignment base material 118 in the area devoid of the MTJ stack while forming a pattern for the MTJ element TJ. The etching process removed the exposed portions of the ARC layer 152 and the hard mask layer 148 and a partial thickness of the MTJ stack top layers 137 therebelow. In the KERF area, the etching process forms patterned features 156 comprising grooves 156A and grooves 156O as it etches through the ARC layer 152 and the grooves 156A and 156O extend more deeply into the bottom stack conductor layer 136 and partially down through the VA alignment base material 118 composed of refractory material thereby forming a plurality of patterned features 156 in the bottom stack conductor layer 136 and etching continues deeper with the grooves 156A and 156O shown reaching down into the VA alignment base 118 without extending therethrough. The patterned features 156 include alignment features 156A, OVERLAY Box features 156O, and an MTJ feature 156E for MTJ element TJ below the plurality of parallel alignment mark patterns 154A, the OVERLAY Box patterns 154O, and the MTJ element pattern 154E of the JA level mask 154. In summary, the alignment mark features 156A are formed extending through exposed portion of the ARC layer 152 in the KERF region, extending through the bottom stack conductor layer 136 and extending down into the conductive, VA alignment base material 118 composed of refractory material. The etch can also extend beyond the refractory material 118 into the M2 dielectric. Thus the alignment mark features 156A are carved into the alignment region simultaneously as each MTJ TJ is being patterned.

Step J

Figure 4J:
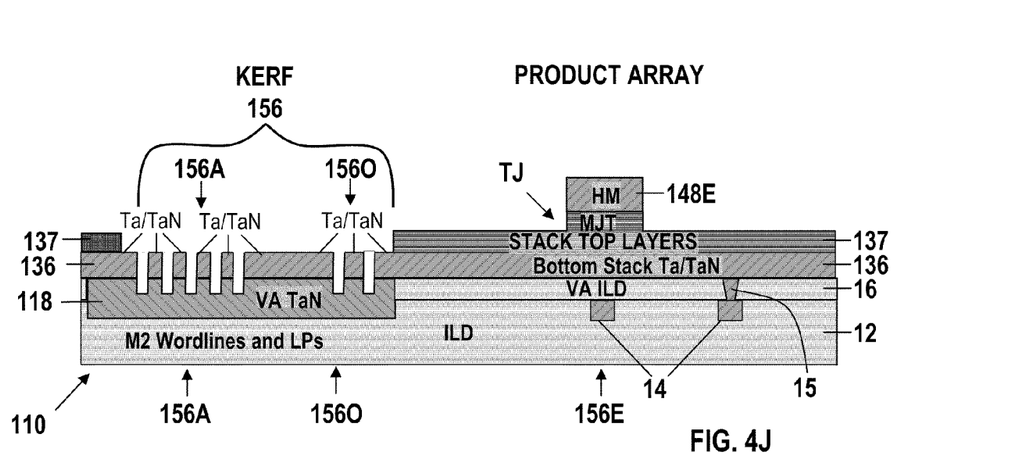

FIG. 4J shows the device 110 of FIG. 4I after stripping of the JA level mask 154 including the parallel alignment mark patterns 154A, the two parallel OVERLAY Box pattern lines 154O, and the MTJ element pattern 154E for the MTJ feature TJ and stripping the remainder of the ARC layer 152, leaving the parallel alignment mark features 156A, the two parallel OVERLAY Box features 156O, and an MTJ element 156E including the top surfaces thereof exposed.

Step K

Figure 4K:
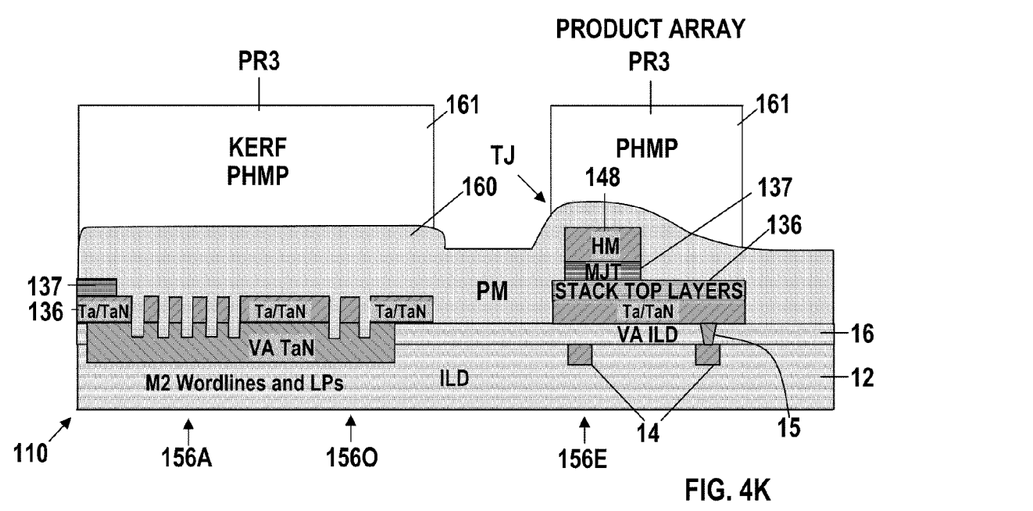

FIG. 4K shows the device 110 of FIG. 4J after forming a conformal layer of a protective hard mask (PM) layer 160 followed by formation of a PR3 mask 161 comprising a Protective Hard Mask Patterning (PHMP) mask over the kerf region and over the MTJ element TJ. The PM layer 160 comprises the hard mask for the MA patterning level. The MA patterning level is the level at which the second portion of the MTJ stack etch is performed during which the TJs are isolated from one another. In the JA patterning level, simply the Free Layer (FL) and layers therebelow down only to the VA ILD level 16 are patterned whereas the layers underneath are still present for making the connection to the VA Via.

Step L

Figure 4L:
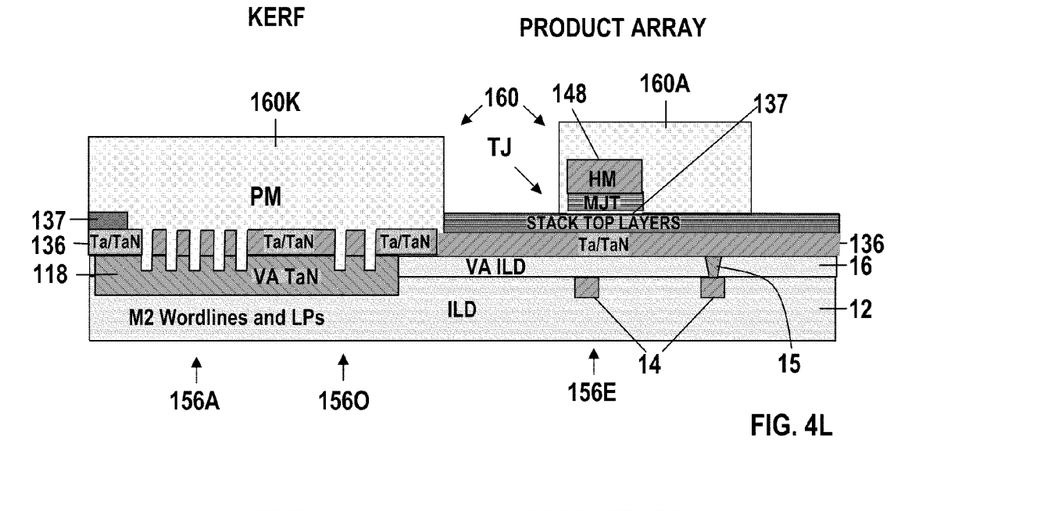

FIG. 4L shows the device 110 of FIG. 4K after anisotropic etching away of the protective layer 160 aside from the masks 161, followed by removal thereof. The individual MTJs TJ are isolated from each other by the MA metal level etching step L in FIG. 6, and the alignment marks 156A and 156O are protected from etching by the PM layer 160K. In FIG. 4L the MTJ element TJ is shown covered by PM layer 160A aside from the PM layer 160K. The PM layer 160A and the PM layer 160K are portions of the PM layer 160 which had been covered by the PR3 PHMP mask 161 as shown in FIG. 4K.

Figure 5:
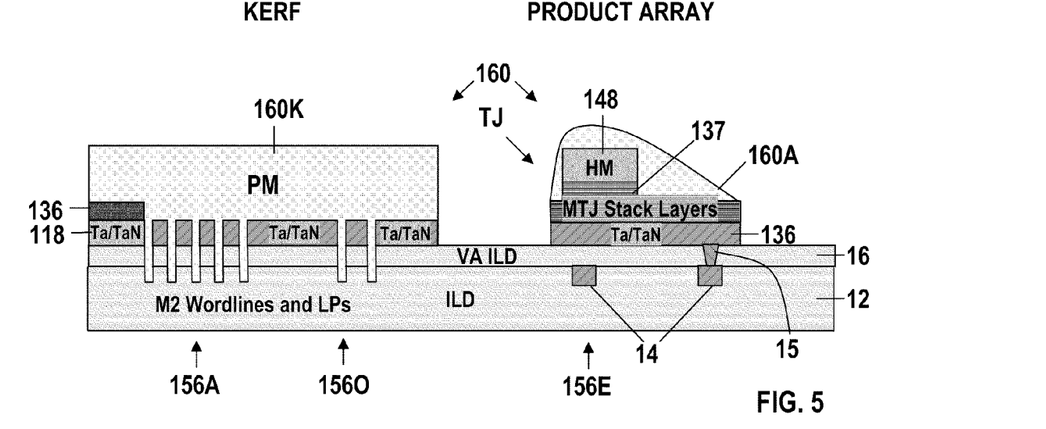
FIG. 5 shows a modification of the structure shown in FIG. 4K from which the VA alignment base has been omitted and parallel alignment mark features and two parallel OVERLAY Box features are formed in the VA ILD layer and the ILD layer, reaching only partially through the thickness of the ILD layer.

FIG. 5 shows a modification of the structure shown in FIG. 4L in which the VA alignment base 118 shown in FIGS. 4D-4L has been omitted and the parallel alignment mark features 156A comprising grooves, the two parallel OVERLAY Box features 156O comprising grooves are formed reaching down through the VA ILD layer 16 and extending down through the surface of the ILD substrate layer 12 into the body thereof, reaching only partially through the thickness of the ILD substrate layer 12. The individual MTJs TJ are isolated from each other by a MA metal level etching (similar to step L in FIG. 6 as will be well understood by those skilled in the art), and the alignment marks 156A and 156O are protected from etching by the PM layer 160K. In FIG. 5 the MTJ element TJ is shown covered a PM layer 160A.

Figure 6:
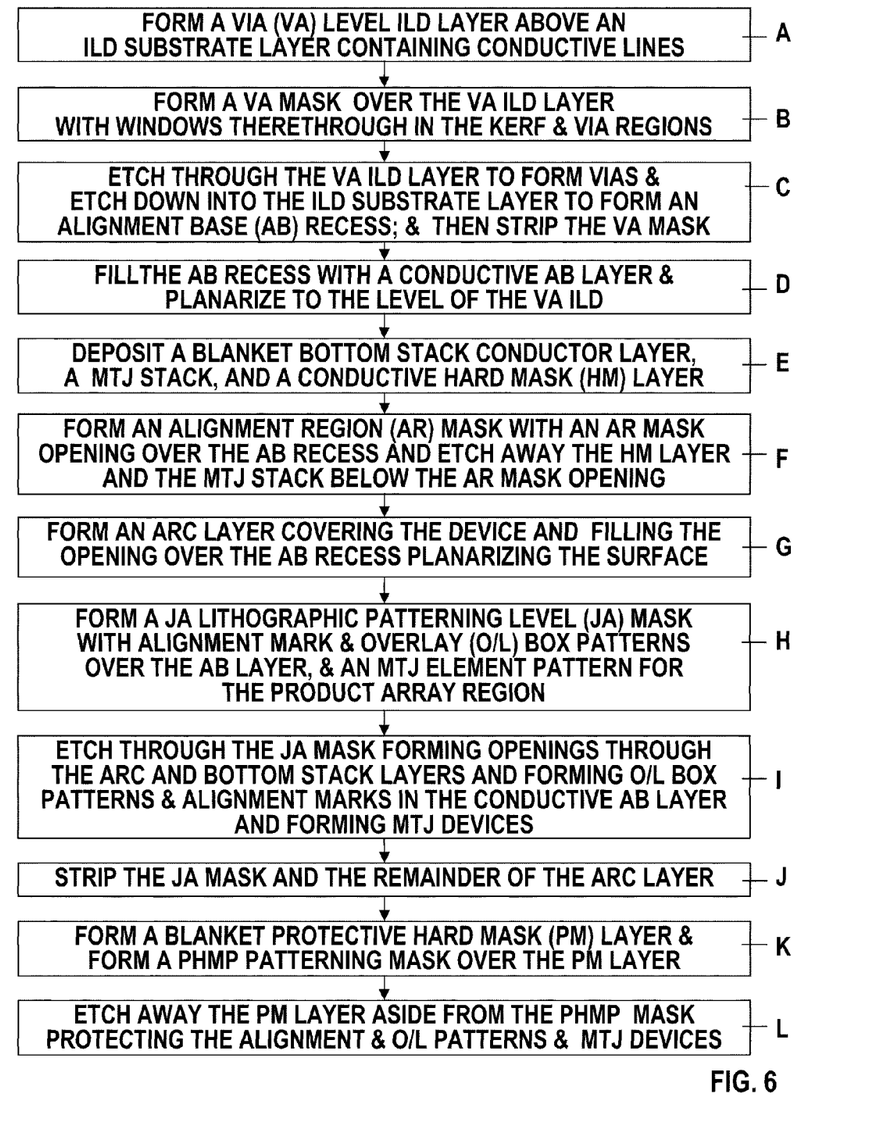
FIG. 6 is a flow chart of the process steps illustrated by FIGS. 4A-4K

FIG. 6 is a flow chart of the process steps illustrated by FIGS. 4A-4K

Figure 7:
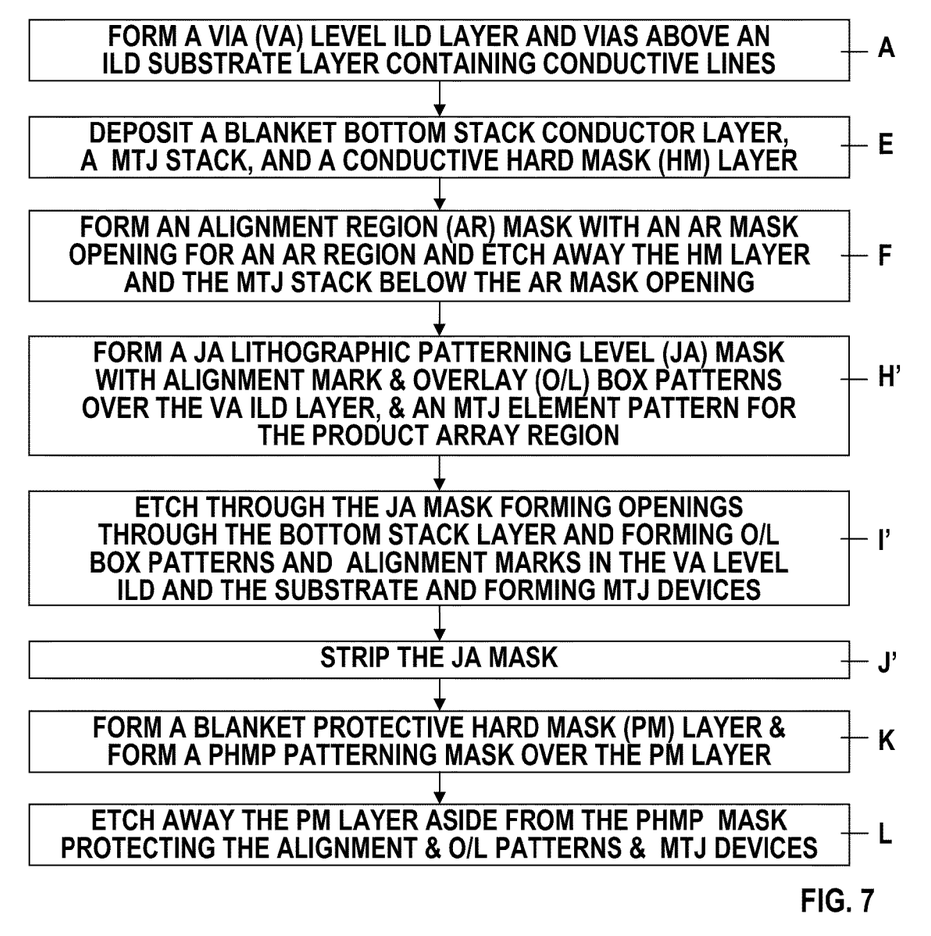
FIG. 7 is a flow chart of steps for manufacturing the device seen in FIG. 5.

FIG. 7 is a flow chart of steps for manufacturing the device seen in FIG. 5. The processing steps have been modified to form the device of FIG. 5, with steps B, C, and F of FIG. 6 having been omitted and steps G, H and I having been revised to steps G', H' and I' in view of the absence of the conductive AB layer 118 and the ARC layer, plus the fact that the alignment marks are formed in the substrate 12 instead of the conductive AB layer 118.

Figure 8:
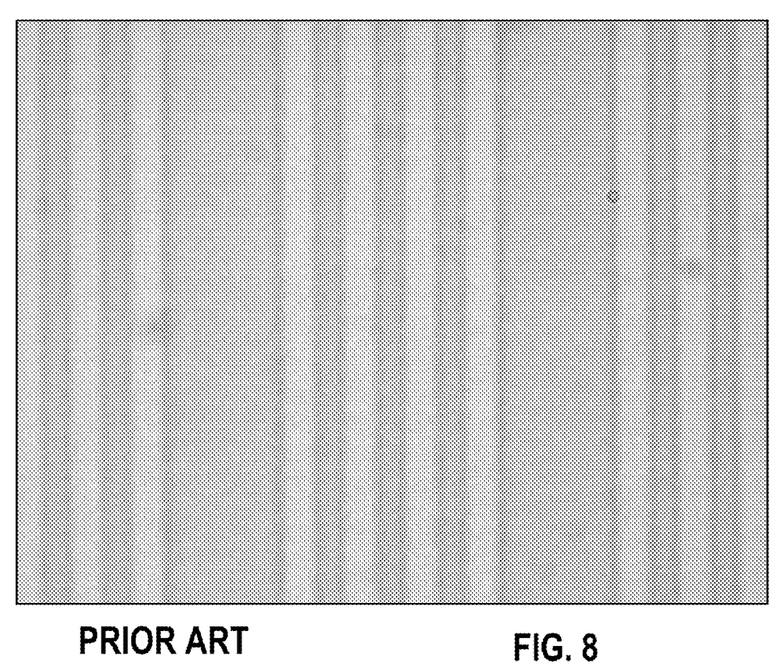
FIG. 8 is an optical image of a prior art alignment marks with additional correction.

FIG. 8 is an optical image of a prior art alignment marks with additional correction.

Figure 9:
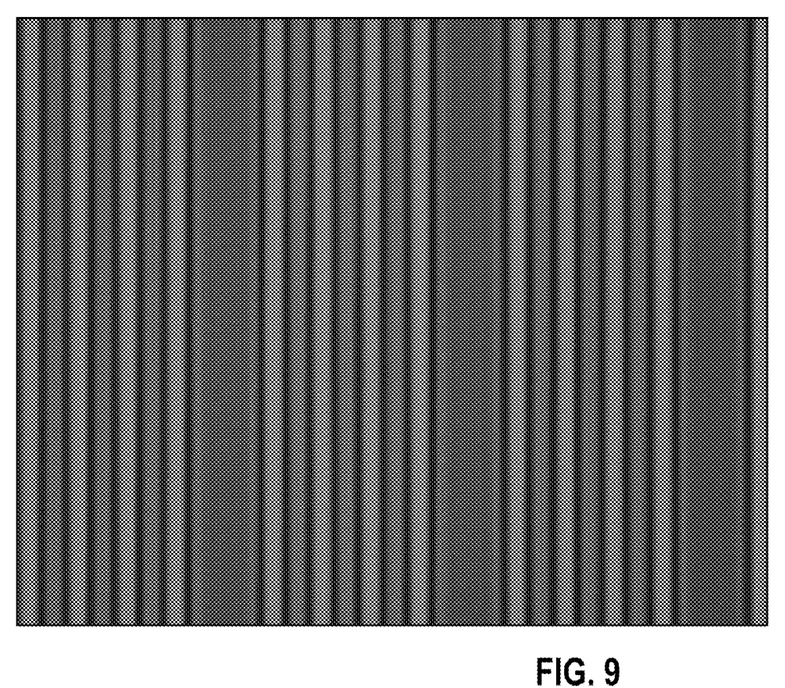
FIG. 9 is an optical image of an alignment marks in accordance with this invention without correction.

FIG. 9 is an optical image of an alignment marks in accordance with this invention without correction.

The present invention comprises a magnetic memory device including a MTJ device formed on a substrate including Front End of Line (FEOL) circuitry. In addition, a VA ILD layer is formed over at least a portion of the substrate, a bottom conductor layer is formed over the top surface of the VA ILD layer; an MTJ device is formed over the bottom conductor layer; and an alignment region which is juxtaposed with the MJT device, includes alignment marks extending through the bottom conductor layer and extending down into the device below the top surface of the VA ILD layer. Preferably, the alignment marks are formed in an area where material of the MTJ device is absent. It is preferred that an alignment base layer is formed below the VA ILD layer. The alignment marks extend through the VA ILD layer and at least into the alignment base layer; and the alignment base layer is composed of a refractory material. Preferably, the alignment marks extend through the VA ILD layer and at least into the substrate; the substrate comprises an ILD layer for electrical connection lines; and the VA ILD and the bottom conductor layer are composed of refractory materials. Preferably, a PHMP mask is formed over the alignment marks and the MJT device with the MJT device including a free layer, a pinned layer and a tunnel barrier layer disposed between the free layer and the pinned layer.

In accordance with the method of this invention a magnetic memory device is formed including a MTJ device by the following steps. Form a via level ILD layer over a substrate. Form a bottom stack conductor layer, an MTJ stack and a conductive hard mask layer over the ILD layer. Form an alignment mask over the device exposing an alignment region. Then etch away the hard mask layer and expose the bottom stack conductor in the alignment region thereby separating the MTJ stack from the alignment region. Form a JA mask with openings over the alignment region and aside therefrom except for an MJT region aside from the alignment region. Then etch through the pattern openings in the JA mask to perform MJT element patterning and alignment mark patterning below the JA mask. Preferably, strip the JA mask after etching therethrough. Then form a PHMP mask over the device covering the alignment region. Preferably, the bottom stack conductor layer in the alignment region contains material similar in etch characteristics to the conductive hard mask layer aside from the MJT element. It is preferred that an MJT element is formed over the bottom stack conductor layer and alignment marks are carved through the bottom stack conductor layer in the alignment region during etching through the JA mask. Preferably, form an alignment base recess extending through the via level ILD layer and down into the top surface of the substrate prior to forming the bottom stack conductor layer, the MTJ stack and the conductive hard mask layer. Form a conductive, alignment base composed of refractory material filling the alignment base recess; and planarize the conductive alignment base It should be understood that the foregoing description is only illustrative of the present invention. The foregoing description discloses only exemplary embodiments of the present invention, and various alternatives and modifications thereof can be devised by those skilled in the art without departing therefrom. Modifications of the above disclosed apparatus and methods which fall within the scope of the present invention will be readily apparent to those of ordinary skill in the art. While this present invention is described in terms of the above specific exemplary embodiment(s), those skilled in the art will recognize that practice thereof with modifications within the spirit and scope of the appended claims, i.e. changes can be made in form and detail, without departing from the spirit and scope of the present invention. Accordingly, while the present invention is disclosed in connection with exemplary embodiments thereof, it should be understood that changes can be made to provide other embodiments which may fall within the spirit and scope of the invention and all such changes come within the purview of the present invention and the invention encompasses the subject matter defined by the following claims; and the present invention is intended to embrace all such alternatives, modifications, and variances which fall within the scope of the appended claims.

What is claimed is:

1. A method of forming a magnetic memory device including a Magnetic Tunnel Junction (MTJ) device in a product array region juxtaposed with a kerf region with alignment marks therein comprising the following steps:
    then forming a via level InterLayer Dielectric (ILD) layer over a substrate;
    forming a kerf region recess extending down into said substrate;
    then filling said kerf region recess with an alignment base layer;
    then forming a bottom stack conductor layer with a to surface, an MTJ stack layer, and a conductive hard mask layer over said alignment base layer and said ILD layer;
    then forming an alignment mask over said device with a window therethrough exposing said hard mask layer in said kerf region;
    then etching away said hard mask layer and said MTJ stack layer in said kerf region exposing said to surface of said bottom stack conductor in said kerf region thereby separating said MTJ stack layer in said product array region from said kerf region;
    forming a planarizing coating over said device;
    then forming a Lithographic Patterning Level (JA) level mask with openings over said planarizing coating in said kerf region with no opening over said MJT stack layer in said product array region aside from said kerf region; and
    then etching through said pattern openings in said JA level mask to form MJT elements from said MJT stack in said product array region below said JA level mask and to form alignment marks in said kerf region below said JA level mask extending through said bottom conductor layer and extending down into said device below said top surface of said VA ILD layer.

2. The method of claim 1 including the following steps:
    stripping said JA mask level after etching therethrough; and forming a Protective Hard Mask Patterning (PHMP) mask over said device covering said alignment region.

3. The method of claim 1 wherein said bottom stack conductor layer in said alignment region contains material similar in etch characteristics to said conductive hard mask layer aside from said MJT element.

4. The method of claim 3 including the following steps:
stripping said JA level mask after etching therethrough; and
forming a Protective Hard Mask Patterning (PHMP) mask over said device covering said alignment region.

5. The method of claim 1 wherein an MJT element is formed over said bottom stack conductor layer and alignment marks are carved through said bottom stack conductor layer in said alignment region during etching through said JA level mask.

6. The method of claim 1 including the following steps:
stripping said JA level mask after etching therethrough; and
forming a Protective Hard Mask Patterning (PHMP) mask over said device covering said alignment region.

7. The method of claim 1 including the following steps:
after forming said kerf region recess extending through said via level ILD layer and down into the top surface of said substrate prior to forming said bottom stack conductor layer, said MTJ stack and said conductive hard mask layer; then forming said alignment base layer composed of a conductive, refractory material filling said the alignment base recess; and
planarizing said conductive alignment base.

8. The method of claim 7 wherein said bottom stack conductor layer in said alignment region contains material similar in etch characteristics to said conductive hard mask layer aside from said MJT element.

9. The method of claim 8 including the following steps:
stripping said JA level mask after etching therethrough; and
forming a Protective Hard Mask Patterning (PHMP) mask over said device covering said alignment region.

10. The method of claim 7 wherein an MJT element is formed over said bottom stack conductor layer and alignment marks are carved through said bottom stack conductor layer in said alignment region during etching through said JA mask.

11. The method of claim 10 including the following steps:
stripping said JA level mask after etching therethrough; and
forming a Protective Hard Mask Patterning (PHMP) mask over said device covering said alignment region.

12. The method of claim 7 including the following steps:
stripping said JA level mask after etching therethrough; and
forming a Protective Hard Mask Patterning (PHMP) mask over said device covering said alignment region.

13. A method of forming a magnetic memory device including a Magnetic Tunnel Junction (MTJ) device in a product array region juxtaposed with a kerf region with alignment marks therein comprising the steps as follows:
forming a substrate and Front End of Line (FEOL) circuitry;
forming a Via level (VA) InterLayer Dielectric (ILD) layer over at least a portion of said substrate with said ILD layer having a top surface;
then forming a kerf region recess extending down into said substrate and filling said kerf region recess with an alignment base layer;
forming a bottom conductor layer over said VA ILD layer and said alignment base material;
forming MTJ stack layers over said bottom conductor layer in said product array region;
then forming a patterning mask for patterning of said MTJ device and said alignment marks;
then etching to form said MTJ device in said product array region and to form said alignment marks in said kerf region juxtaposed with said MTJ device with said alignment marks extending through said bottom conductor layer and extending down into said device below said top surface of said VA ILD layer.

14. The method of claim 13 wherein said alignment marks are formed in an area of said kerf region where material of said MTJ device is absent.

15. The method of claim 14 including:
forming said alignment marks extending through said VA ILD layer and at least into said alignment base layer; and
said alignment base layer being composed of a refractory material.

16. The MTJ device of claim 15 including the step of forming a Protective Hard Mask Patterning (PHMP) mask over said alignment marks and said MTJ device.

17. The method of claim 14 wherein said alignment marks extend through said VA ILD layer and at least into said substrate in said kerf region.

18. The MTJ device of claim 17 including the step of forming a Protective Hard Mask Patterning (PHMP) mask over said alignment marks and said MTJ device, with said MTJ device including a free layer, a pinned layer and a tunnel barrier layer disposed between said free layer and said pinned layer.

19. The method of claim 14 wherein said substrate comprises an ILD layer with electrical connection lines formed therein.

20. The MTJ device of claim 14 including the step of forming a Protective Hard Mask Patterning (PHMP) mask over said alignment marks and said MTJ device.

21. The method of claim 13 wherein said VA ILD and said bottom conductor layer are composed of refractory materials.

22. The method of claim 13 including the step of forming a Protective Hard Mask Patterning (PHMP) mask over said alignment marks and said MTJ device.

* * * * *